United States Patent
Guo et al.

(10) Patent No.: US 10,790,341 B2
(45) Date of Patent: Sep. 29, 2020

(54) ARRAY SUBSTRATE, FABRICATION METHOD THEREOF AND ORGANIC LIGHT-EMITTING DIODE DISPLAY DEVICE

(71) Applicant: BOE TECHNOLOGY GROUP CO., LTD., Beijing (CN)

(72) Inventors: Yidong Guo, Beijing (CN); Chunping Long, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 99 days.

(21) Appl. No.: 14/914,350

(22) PCT Filed: Nov. 19, 2015

(86) PCT No.: PCT/CN2015/095056
§ 371 (c)(1),
(2) Date: Feb. 25, 2016

(87) PCT Pub. No.: WO2016/184063
PCT Pub. Date: Nov. 24, 2016

(65) Prior Publication Data
US 2016/0343780 A1 Nov. 24, 2016

(30) Foreign Application Priority Data
May 18, 2015 (CN) .......................... 2015 1 0253423

(51) Int. Cl.
*H01L 27/32* (2006.01)
*H01L 31/18* (2006.01)
(Continued)

(52) U.S. Cl.
CPC ........ *H01L 27/3227* (2013.01); *H01L 27/142* (2013.01); *H01L 31/068* (2013.01);
(Continued)

(58) Field of Classification Search
CPC ............. H01L 27/3227; H01L 51/0097; Y02P 70/521; Y02E 10/547
See application file for complete search history.

(56) References Cited

U.S. PATENT DOCUMENTS

2006/0030084 A1* 2/2006 Young ................. H01L 27/1214
438/149
2007/0001167 A1* 1/2007 Nomura ................. B82Y 10/00
257/40
(Continued)

FOREIGN PATENT DOCUMENTS

CN 101127362 A 2/2008
CN 101520584 A 9/2009
(Continued)

OTHER PUBLICATIONS

Search Report and Written Opinion dated Jan. 13, 2016 from State Intellectual Property Office of the P.R. China.
(Continued)

*Primary Examiner* — Vongsavanh Sengdara
(74) *Attorney, Agent, or Firm* — Dilworth & Barrese, LLP.; Michael J. Musella, Esq.

(57) ABSTRACT

An array substrate, a fabrication method thereof, and an organic light-emitting diode display device are provided; the array substrate (10) comprises a base substrate (100), the base substrate (100) including a display region (102) and a peripheral region (101) surrounding the display region (102), the display region (102) including: a plurality of data lines (12) and a plurality of gate lines (11) intersecting with each other, a plurality of pixel regions (21), formed in a matrix and defined by the plurality of data lines (12) and the plurality of gate lines (11) intersecting with each other formed on the base substrate (100), wherein a thin film transistor (32) is formed in each of the plurality of pixel regions (21); and further, the array substrate (10) also
(Continued)

comprises at least one solar cell unit (31), which, together with the thin film transistor (32), is located on a same side of the base substrate (100), and is formed in at least one of the plurality of pixel regions (21) and the peripheral region (101).

18 Claims, 5 Drawing Sheets

(51) Int. Cl.
    *H01L 31/068*     (2012.01)
    *H01L 27/142*     (2014.01)
    *H01L 51/00*     (2006.01)

(52) U.S. Cl.
    CPC ...... *H01L 31/1804* (2013.01); *H01L 27/3244* (2013.01); *H01L 51/0097* (2013.01); *H01L 2227/323* (2013.01); *H01L 2227/326* (2013.01); *H01L 2251/5338* (2013.01); *Y02E 10/547* (2013.01); *Y02P 70/521* (2015.11)

(56) References Cited

U.S. PATENT DOCUMENTS

| | | | | |
|---|---|---|---|---|
| 2007/0164293 | A1* | 7/2007 | Hamano | H01L 31/112 257/79 |
| 2008/0290433 | A1* | 11/2008 | Sanders | H01L 31/115 257/429 |
| 2009/0207473 | A1 | 8/2009 | Bita et al. | |
| 2009/0243498 | A1* | 10/2009 | Childs | G09G 3/3233 315/169.3 |
| 2009/0250708 | A1* | 10/2009 | Kudo | H01L 31/145 257/84 |
| 2010/0065851 | A1* | 3/2010 | Makita | H01L 27/1281 257/72 |
| 2010/0114679 | A1* | 5/2010 | Pan | G06Q 30/02 705/14.4 |
| 2010/0328269 | A1* | 12/2010 | Kurokawa | G06F 3/042 345/175 |
| 2011/0073918 | A1* | 3/2011 | Makita | H01L 27/1229 257/255 |
| 2011/0096009 | A1* | 4/2011 | Kurokawa | G06F 3/042 345/173 |
| 2011/0175086 | A1* | 7/2011 | Katoh | H01L 27/14692 257/53 |
| 2011/0193168 | A1* | 8/2011 | Kaigawa | G02F 1/1368 257/350 |
| 2011/0205209 | A1* | 8/2011 | Kurokawa | G06F 3/0416 345/211 |
| 2011/0221945 | A1* | 9/2011 | Kurokawa | G06F 3/0412 348/300 |
| 2011/0227878 | A1* | 9/2011 | Makita | H01L 27/1229 345/175 |
| 2011/0273390 | A1* | 11/2011 | Nakatsuji | H01L 27/14632 345/173 |
| 2012/0305930 | A1* | 12/2012 | Makita | H01L 27/1222 257/72 |
| 2016/0041310 | A1 | 2/2016 | Yang et al. | |

FOREIGN PATENT DOCUMENTS

| | | |
|---|---|---|
| CN | 100570903 C | 12/2009 |
| CN | 101952763 A | 1/2011 |
| CN | 101995691 A | 3/2011 |
| CN | 102593152 A | 7/2012 |
| CN | 103105706 A | 5/2013 |
| CN | 103473997 A | 12/2013 |
| CN | 103887368 A | 6/2014 |
| CN | 103928474 A | 7/2014 |
| CN | 103985734 A | 8/2014 |
| CN | 104867964 A | 8/2015 |
| KR | 20130006203 A | 1/2013 |

OTHER PUBLICATIONS

First Chinese Office Action dated May 11, 2017.
Second Chinese Office action dated Jan. 4, 2018.

* cited by examiner

ARRAY SUBSTRATE, FABRICATION METHOD THEREOF AND ORGANIC LIGHT-EMITTING DIODE DISPLAY DEVICE

TECHNICAL FIELD

Embodiments of the present disclosure relate to an array substrate, a fabrication method thereof and an organic light-emitting diode display device.

BACKGROUND

An Organic Light Emitting Display (OLED) becomes one of a new generation of major displays, due to many advantages such as active luminescence, high contrast, fast response, lightness and thinness. A working principle thereof is applying an appropriate voltage to an anode and a cathode, so that an organic light-emitting layer located between the anode and the cathode emits light, so as to display an image.

A solar cell unit is a semiconductor device which directly converts solar energy into electrical energy. For example, the solar cell unit may be divided into a silicon-based thin-film solar cell unit, a compound-based thin-film solar cell unit, and an organics-based solar cell unit, wherein the silicon-based solar cell unit may be mainly divided into a mono-crystalline silicon solar cell unit, a poly-crystalline silicon solar cell unit and an amorphous silicon solar cell unit Exemplarily, FIG. 1 shows a cross-sectional view of a poly-crystalline silicon solar cell unit, and as shown in FIG. 1, after a PN junction formed by an N-type semiconductor 2 and a P-type semiconductor 3 is irradiated, bound electrons in a high energy level state are excited and become free electrons, the free electrons move in all directions within the liquid crystal, and when it is connected with an outer closed loop through a first electrode 1 and a second electrode 4, current is generated.

With continuous development of a display technology, how to integrate the organic electroluminescent display and the solar cell unit together becomes a main research direction of a current high technology.

SUMMARY

Embodiments of the present disclosure provide an array substrate, a fabrication method thereof and an organic light-emitting diode display device; and a solar cell unit is fabricated in an array substrate, to lower the production cost and improve the yield, so that the product is easy to be implemented.

In one aspect, an embodiment of the present disclosure provides an array substrate, comprising: a base substrate, including: a display region, including: a plurality of data lines and a plurality of gate lines intersecting with each other, a plurality of pixel regions, formed in a matrix and defined by the plurality of data lines and the plurality of gate lines intersecting with each other formed on the base substrate, wherein a thin film transistor is formed in each of the plurality of pixel regions; a peripheral region, surrounding the display region; and at least one solar cell unit, located on a same side of the base substrate with the thin film transistor, and formed in at least one of the plurality of pixel regions and the peripheral region.

In another aspect, an embodiment of the present disclosure further provides a fabrication method of the above-described array substrate, comprising: preparing a base substrate, wherein, the base substrate includes a display region and a peripheral region surrounding the display region; forming a plurality of gate lines, a plurality of data lines, a plurality of pixel regions defined by the plurality of data lines and the plurality of gate lines, a thin film transistor located in each of the pixel regions, and at least one solar cell unit located in at least one of the plurality of pixel regions and the peripheral region, on a same side of the base substrate.

In still another aspect, an embodiment of the present disclosure further provides an organic light-emitting diode display device, comprising: an array substrate as described above and an opposed substrate opposite to the array substrate.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

Figure 1:
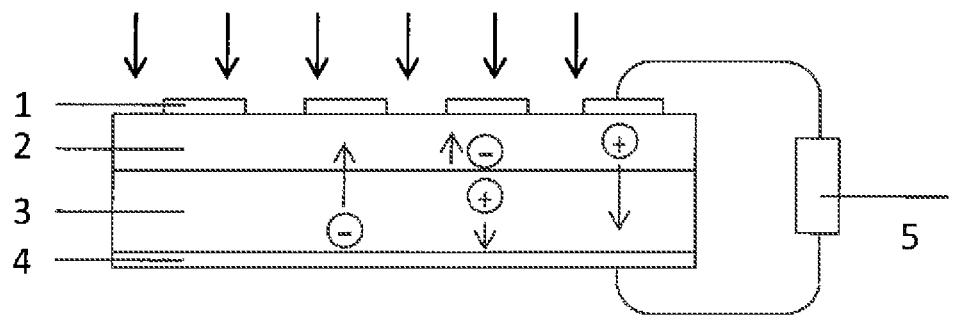
FIG. 1 is a schematic diagram of a working principle of a solar cell unit.

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments of the present disclosure, those ordinarily skilled in the art can obtain other embodiment(s), without any inventive work, which should be within the protective scope of the present disclosure.

Unless otherwise defined, the technical terms or scientific terms here should be of general meaning as understood by those ordinarily skilled in the art. In the present disclosure, words such as "first", "second" and the like do not denote any order, quantity, or importance, but rather are used for distinguishing different components. Similarly, words such as "one", "a/an" or "the" or the like do not denote quantitative limitation, but rather indicate there is at least one. Words such as "include" or "comprise" and the like denote that elements or objects appearing before the words of "include" or "comprise" cover the elements or the objects enumerated after the words of "include" or "comprise" or equivalents thereof, not exclusive of other elements or objects. Words such as "connected" or "connecting" and the like are not limited to physical or mechanical connections, but may include electrical connection, either direct or indirect. Words such as "up", "down", "left", "right" and the like are only used for expressing relative positional relationship, when the absolute position is a described object is changed, the relative positional relationship may also be correspondingly changed.

Embodiments of the present disclosure provide an array substrate, a fabrication method thereof and an organic light-emitting diode display device.

The array substrate according to an embodiment of the present disclosure comprises a base substrate, the base substrate including a display region and a peripheral region surrounding the display region, wherein the display region includes a plurality of pixel regions formed in a matrix, and defined by a plurality of data lines and a plurality of gate lines intersecting with each other, and a thin film transistor is formed in each pixel region. Further, the array substrate also comprises at least one solar cell unit; the at least one solar cell unit and the thin film transistor are located on a same side of the base substrate and are formed in at least one of the plurality of pixel regions and the peripheral region. Since the solar cell unit is disposed in the array substrate, the solar cell unit may be formed by a photolithography process, and further, the solar cell unit and the thin film transistor are formed on a same side of the base substrate; as a result, the solar cell unit and the thin film transistor may be formed by a same process, so that on a premise that a process and a fabrication material are not added, by using a fine photolithography process, the solar cell unit is fabricated in a thin film transistor array substrate, which thereby can reduce the production cost, improve the yield and make a product easy to be implemented.

Further, when a flexible base substrate is used for the array substrate, the array substrate may be used in a flexible display device, which, thus, can implement thin and light-weighted flexible display which is bendable and even rollable, so that it can be applied to a watch, clothing, a backpack and other wearable products. Especially, when the array substrate is applied to an organic light emitting display device, an organic electroluminescent display device integrated with the solar cell unit can be obtained.

Hereinafter, the array substrate, the fabrication method thereof, and the organic light-emitting diode display device provided by an embodiment of the present disclosure will be described in detail in conjunction with the drawings, so that the technical solutions of the present disclosure will become clearer.

A First Embodiment

Figure 2:
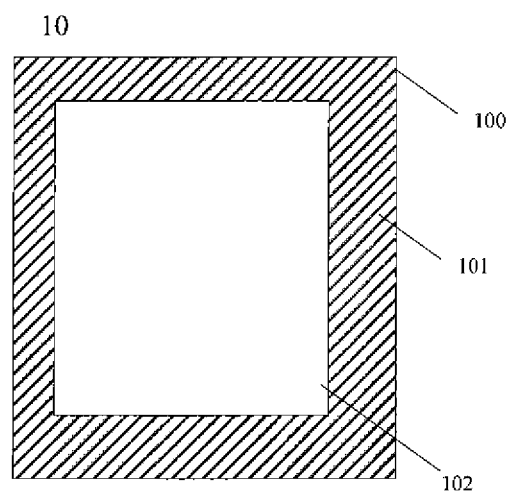
FIG. 2 is a plan view of a base substrate according to an embodiment of the present disclosure.
Figure 3:
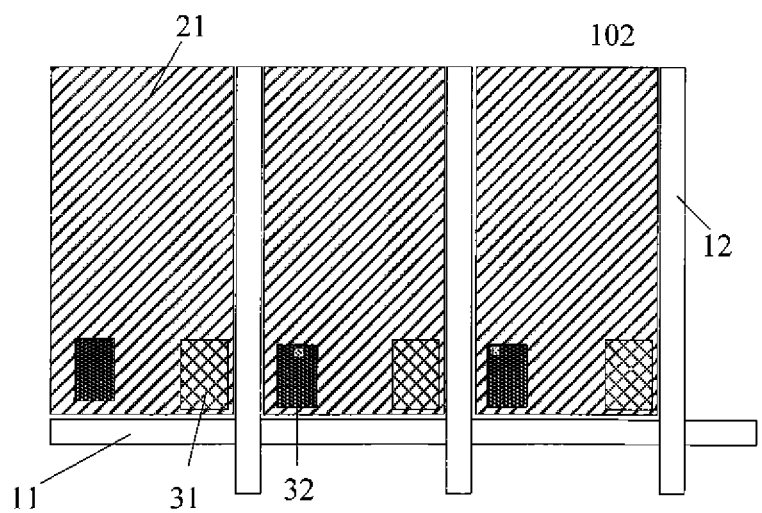
FIG. 3 is an exemplary plan view of an array substrate whose pixel region is provided with a solar cell unit according to an embodiment of the present disclosure.

As shown in FIG. 2, an array substrate 10 comprises a base substrate 100, the base substrate 100 including a display region 102 and a peripheral region 101 surrounding the display region 102, wherein, as shown in FIG. 3, the display region 102 includes a plurality of data lines 12 and a plurality of gate lines 11 intersecting with each other, which divide the display region 102 into a plurality of pixel regions 21, and a thin film transistor 32 is disposed in each of the pixel regions 21. Further, at least one solar cell unit is also formed on the base substrate 100, the at least one solar cell unit, together with the thin film transistor 32, is located on a same side of the base substrate 100, and is formed within at least one of the plurality of pixel regions 21 and the peripheral region 101.

In this embodiment, the at least one solar cell unit may be disposed in the pixel region 21 or the peripheral region 101, or may be disposed in both the pixel region 21 and the peripheral region 101. For example, if there is one solar cell unit, then it may be disposed in one pixel region 21 or the peripheral region 101; and if the array substrate 10 comprises two or more solar cell units, all the solar cell units may be disposed in the pixel region 21 or all of them may be disposed in the peripheral region 101, or a part of them are disposed in the pixel region while the others are disposed in the peripheral region 101.

Further, each pixel region may be provided therein with only one solar cell unit, or may be provided therein with two or more solar cell units, and those skilled in the art may appropriately select on a premise that an aperture ratio and other product features are taken into account, which is not specifically limited by an embodiment of the present disclosure.

FIG. 3 shows an exemplary plan view of an array substrate whose pixel region is provided with a solar cell unit according to an embodiment of the present disclosure, wherein, only three pixel regions are shown, each pixel region is provided therein with one solar cell unit 31, and for convenience of illustration, the solar cell unit 31 and the thin film transistor 32 are represented by shaded blocks, but it does not mean that both have a block shape, and the blocks only represent regions where the two are disposed. It can be seen from the diagram that, the solar cell unit 31 and the thin film transistor 32 are disposed in different regions, and exemplarily, in order not to reduce an effective display region, the solar cell unit 31 may be disposed in a region corresponding to a black matrix, a region corresponding to the gate line or the data line, or a region corresponding to both the gate line and the data line.

Exemplarily, each solar cell unit 31 may include a first doped semiconductor layer, the thin film transistor 32 may include a second doped semiconductor layer, and the first doped semiconductor layer and the second doped semiconductor layer are located in a same layer.

Alternatively, the solar cell unit 31 may be of a PN configuration, the first doped semiconductor layer may include a P-type semiconductor and an N-type semiconductor, and the P-type semiconductor and the N-type semiconductor are located in a same layer. It should be noted that, the P-type semiconductor is a doped semiconductor whose hole concentration is much greater than a free electron concentration, formed by doping a trivalent element, e.g., boron or the like into a semiconductor material, e.g., a silicon crystal; and the N-type semiconductor is a doped semiconductor whose electron concentration is much greater than a hole concentration, formed by doping a pentavalent element, e.g., phosphorus, arsenic, antimony or the like, into the silicon crystal.

Alternatively, the second doped semiconductor layer of the thin film transistor 32 may include an intermediate doped portion and side doped portions located on both sides of the intermediate doped portion, which are formed in a same layer, wherein the intermediate doped portion and the side doped portions have opposite doping types, that is, if the intermediate doped portion is of P type, then correspondingly, the side doped portions are of N type; and if the intermediate doped portion is of N type, then correspondingly, the side doped portions are of P type.

Figure 4:
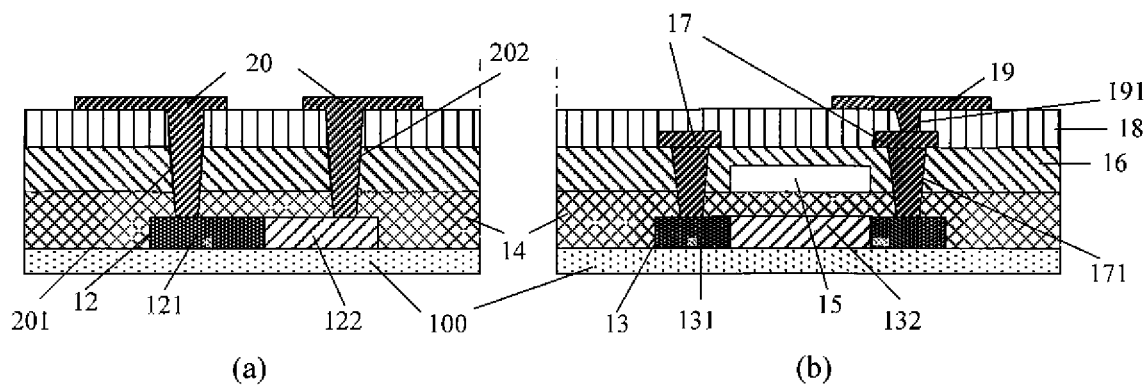
FIG. 4 is a schematic cross-sectional view of an array substrate wherein a first doped semiconductor layer of a solar cell unit and a second doped semiconductor layer of a thin film transistor are in a same layer according to an embodiment of the present disclosure.

FIG. 4 shows a schematic cross-sectional structural diagram of an array substrate wherein a first doped semiconductor layer of the solar cell unit 31 and a second doped semiconductor layer of the thin film transistor 32 are in a same layer, wherein, (a) shows a region where the solar cell unit 31 is located and (b) shows a region where the thin film transistor 32 is located, and here a thin film transistor of a top-gate type is taken as an example. As shown in FIG. 4, the first doped semiconductor layer 12 and the second doped semiconductor layer 13 are disposed in a same layer on the base substrate 100, the first doped semiconductor layer 12 includes a P-type semiconductor 121 and an N-type semiconductor 122, the second doped semiconductor layer 13 includes an intermediate doped portion 132, and side doped portions 131 located on both sides of the intermediate doped portion 132, wherein the side doped portions 131 are shown as the P-type semiconductor, and the intermediate doped portion 132 is the N-type semiconductor, which is merely an example here, and of course, the side doped portions 131 may also be the N-type semiconductor, and correspondingly, the intermediate doped portion 132 is the P-type semiconductor.

Further, in the thin film transistor of the top-gate type given in FIG. 4, a gate insulating layer 14 covers the base substrate 100 with the first doped semiconductor layer 12 and the second doped semiconductor layer 13 formed thereon, a gate electrode 15 is disposed on the gate insulating layer 14 and corresponds to the intermediate doped portion 132, and an interlayer insulating layer 16 covers the gate electrode 15; further, a source electrode and a drain electrode 17 are disposed on the interlayer insulating layer 16, and the source electrode and the drain electrode 17 are electrically connected with the side doped portions 131 respectively through via holes 171 formed in the gate insulating layer 14 and the interlayer insulating layer 16.

Further, in a region where the thin film transistor 32 is located, a planarization layer 18 covers the source electrode and the drain electrode 17, and then, a pixel electrode 19 is disposed on the planarization layer 18 and is electrically connected with the source electrode or the drain electrode 17 through a via hole 191 in the planarization layer 18. Correspondingly, in a region where the solar cell unit 31 is located, two electrodes 20 connected with the P-type semiconductor 121 and the N-type semiconductor 122 respectively through via holes 201 and 202 formed in the gate insulating layer 14, the interlayer insulating layer 16 and the planarization layer 18 are disposed on the planarization layer 18.

For convenience of illustration, FIG. 4 separately illustrates the region where the solar cell unit is located and the region where the thin film transistor is located; however, in practice, other components or no component may be disposed between the region where the solar cell unit is located and the region where the thin film transistor is located, for example, when the solar cell unit is disposed in the peripheral region, other components may be disposed therebetween, which is not shown here for simplicity of illustration, but if there is no other component therebetween, then FIG. 4(a) and FIG. 4(b) may be directly connected together into one diagram, and those skilled in the art may provide according to an actual need, which will not be limited by an embodiment of the present disclosure.

Further, in FIG. 4, it is shown that the gate insulating layer 14, the interlayer insulating layer 16 and the planarization layer 18 are provided above the first doped semiconductor layer 12, which is merely an example, and in practice, those skilled in the art may arrange a layer above the first doped semiconductor layer 12 according to an actual need, for example, only the planarization layer is formed, or the planarization layer and the interlayer insulating layer without the gate insulating layer may be formed.

It should also be noted that, the two electrodes 20 of the solar cell unit may be disposed on the gate insulating layer, or may be disposed on the gate insulating layer and the interlayer insulating layer, and correspondingly, the via hole may be formed only in the gate insulating layer, or the via hole may be formed in the gate insulating layer and the interlayer insulating layer, which will not be limited by an embodiment of the present disclosure, and those skilled in the art may select according to an actual need.

Figure 5:
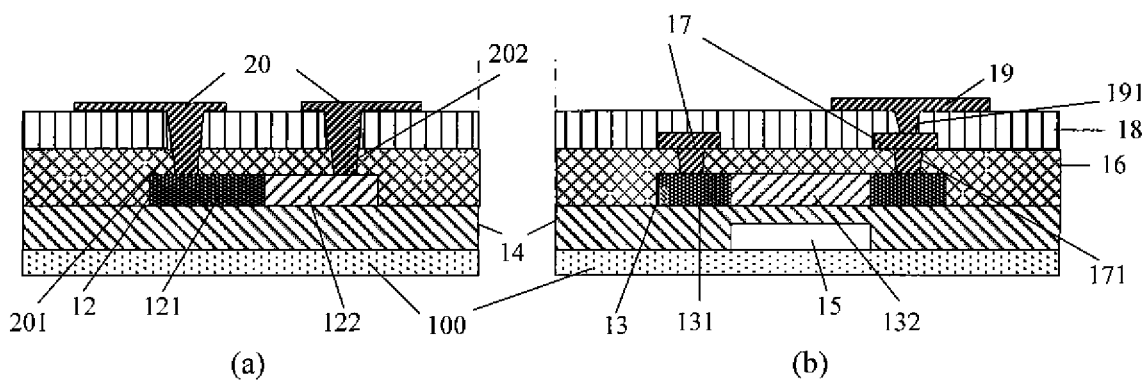
FIG. 5 is a schematic cross-sectional view of an array substrate comprising a thin film transistor of a bottom-gate type according to an embodiment of the present disclosure.

In addition, the thin film transistor according to an embodiment of the present disclosure may further be a thin film transistor of a bottom-gate type, and the gate electrode is formed below the second doped semiconductor layer of the thin film transistor. FIG. 5 shows a schematic cross-sectional view of an array substrate comprising a thin film transistor of a bottom-gate type, wherein (a) is a cross-sectional view of the region where the solar cell unit is located and (b) is the region where the thin film transistor is located, and as shown in FIG. 5, the gate electrode 15 and the gate insulating layer 14 are sequentially formed on the base substrate 100, the first doped semiconductor layer 12 and the second doped semiconductor layer 13 are formed on the gate insulating layer 14, the intermediate doped portion corresponds to the gate electrode 15, and the source electrode and the drain electrode 17 are connected with the side doped portions 131 through a via hole in the interlayer insulating layer 16. Further, a pixel electrode 19 is also disposed in the region where the thin film transistor is located, which is connected with the source electrode or the drain electrode 17 through the via hole 191 in the planarization layer 18, and the two electrodes 20 are also disposed in the region where the solar cell unit is located, which are connected with the P-type or the N-type semiconductor 121 and the N-type or the P-type semiconductor 122 respectively through the via holes 201 and 202 in the planarization layer 18 and the interlayer insulating layer 16. For brevity, differences from what is shown in FIG. 4 are described emphatically here, and same contents are no longer repeated here.

Similarly, only the planarization layer 18 may be disposed above the first doped semiconductor layer 12, and correspondingly, the electrode 20 is connected with the first doped semiconductor layer 12 only through the via hole in the planarization layer.

Here it should be noted that, the electrode 20 connected with the first doped semiconductor layer 12 may also be disposed in other positions, for example, disposed below the first doped semiconductor layer, which will not be limited by an embodiment of the present disclosure, as long as an electrically connecting function can be implemented. Typically, positions of the source electrode and the drain electrode of the thin film transistor may also be set according to an actual need, for example, they may be located below the second doped semiconductor layer, etc., which will not be limited by the embodiment of the present disclosure.

Exemplarily, the first doped semiconductor layer and the second doped semiconductor layer may not be located in a same layer but only located on a same side of the base substrate 100, for example, when the solar cell unit is disposed in the peripheral region, it may be disposed overlapping a peripheral driving circuit of the array substrate, or may be disposed parallel to the peripheral driving circuit of the array substrate.

Figure 6:
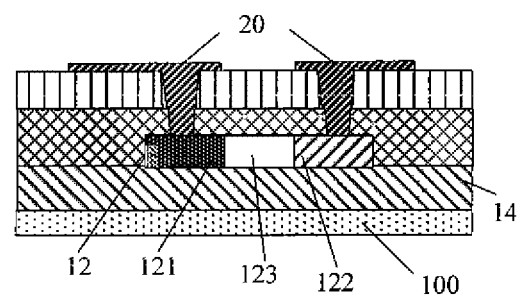
FIG. 6 is a schematic cross-sectional view of a solar cell unit of a PIN configuration according to an embodiment of the present disclosure.

Alternatively, the solar cell unit 31 may also be of a PIN structure, and the first doped semiconductor layer included thereby may also include an intrinsic semiconductor disposed between the P-type semiconductor and the N-type semiconductor. For example, as shown in FIG. 6, the intrinsic semiconductor 123 is located between the P-type semiconductor 121 and N-type semiconductor 122.

Alternatively, the solar cell unit 31 may also be of a PN or PIN structure connected in series, the first doped semiconductor layer may include a plurality of P-type semiconductors and a plurality of N-type semiconductors arranged alternately, and the plurality of P-type semiconductors and the plurality of N-type semiconductors are formed in a same layer; further, the first doped semiconductor layer may further include a plurality of intrinsic semiconductors, and each intrinsic semiconductor is disposed between the P-type semiconductor and the N-type semiconductor adjacent to each other.

Exemplarily, the base substrate 100 may be a bendable flexible substrate, for example, a substrate made of various plastic films, e.g., Polyethylene Terephthalate (PET), Polyether Sulfone (PES), Polycarbonate (PC) or Polyimide (PI) and derivatives thereof. Alternatively, the base substrate 100 may be a rigid substrate, e.g., a glass substrate, a stainless steel substrate or the like.

Exemplarily, the first and the second doped semiconductor layers according to an embodiment of the present disclosure may be a doped poly-crystalline silicon layer, a doped mono-crystalline silicon layer, etc.

Alternatively, the array substrate according to an embodiment of the present disclosure may also include a buffer layer located between the base substrate and respective functional layers formed thereon.

In the array substrate according to the first embodiment, the solar cell unit is disposed therein, for example, the solar cell unit and the thin film transistor are formed on the same side of the base substrate, and as a result, the solar cell unit and the thin film transistor may be formed by a same process, so that on a premise that a process flow and a fabrication material are not added, by using a fine photolithography process, the solar cell unit is fabricated in a thin film transistor array substrate, which thereby can reduce the production cost, improve the yield and make a product easy to be implemented.

A Second Embodiment

The second embodiment of the present disclosure provides a fabrication method of the array substrate according to the first embodiment, comprising: step S1: preparing a base substrate, wherein, the base substrate includes: a display region and a peripheral region surrounding the display region; and step S2: forming a plurality of gate lines, a plurality of data lines, a plurality of pixel regions defined by the plurality of data lines and the plurality of gate lines, a thin film transistor located in each pixel region, and at least one solar cell unit located in at least one of the plurality of pixel regions and the peripheral region, on a same side of the base substrate.

Exemplarily, the solar cell unit may include a first doped semiconductor layer, the thin film transistor may include a second doped semiconductor layer, and the first doped semiconductor layer and the second doped semiconductor layer are located in a same layer. Thus, step S2 may include: simultaneously forming the first doped semiconductor layer and the second doped semiconductor layer by a patterning process and a doping process.

Further, the first doped semiconductor layer includes: a P-type semiconductor and an N-type semiconductor, the second doped semiconductor layer includes an intermediate doped portion and side doped portions located on both sides of the intermediate doped portion and having a doping type opposite to that of the intermediate doped portion, and the simultaneously forming the first doped semiconductor layer and the second doped semiconductor layer by a patterning process and a doping process may include:

Forming a semiconductor material layer on the base substrate, and forming a semiconductor layer by a first patterning process, wherein, semiconductor layers in the thin film transistor region and at least one solar cell unit region are not connected with each other;

Exemplarily, in the embodiment of the present disclosure, the semiconductor layer may be a poly-crystalline silicon layer, or a mono-crystalline silicon layer, and when the semiconductor layer is the poly-crystalline silicon layer, the forming a semiconductor material layer on the base substrate may include: depositing an amorphous silicon layer on the base substrate; and crystallizing the amorphous silicon layer to form the poly-crystalline silicon layer, by using a crystallization method, for example, Excimer-Laser Annealing (ELA), or Solid Phase Crystallization (SPC) and other methods.

Doping a P-type/N-type impurity to the semiconductor layer in the thin film transistor region with a first mask on the base substrate obtained after the preceding steps are completed, to form the intermediate doped portion, and meanwhile doping the P-type/N-type impurity to the semiconductor layer in the solar cell unit region to form the P-type/N-type semiconductor;

Sequentially depositing a gate insulating layer and a gate metal layer on the base substrate after the preceding steps are completed;

Patterning the gate metal layer by a second patterning process, to form a pattern including a gate electrode and a gate line in the thin film transistor region;

Doping the N-type/P-type impurity to the semiconductor layer in the thin film transistor region and both sides of the intermediate doped portion with a second mask, to form the side doped portions, and meanwhile doping the N-type/P-type impurity to an undoped portion of the semiconductor layer in the solar cell unit region, to form the N-type/P-type semiconductor.

Exemplarily, the base substrate according to the embodiment of the present disclosure may be a flexible substrate, for example, a substrate made of various plastic films, e.g., Polyethylene Terephthalate (PET), Polyether Sulfone (PES), Polycarbonate (PC) or Polyimide (PI) and derivatives thereof. Alternatively, the base substrate 100 may be a rigid substrate, e.g., a glass substrate, a stainless steel substrate or the like.

In a case where the base substrate is the flexible substrate, step S1 includes: preparing a glass substrate; and coating a flexible base substrate material, e.g., a polyimide material, on the glass substrate, to form a flexible base substrate. Further, after step S2, the fabrication method of the array substrate according to an embodiment of the present disclosure further comprises: removing the flexible base substrate and the thin film transistor and the at least one solar cell unit formed thereon from the glass substrate.

Further, the fabrication method according to an embodiment of the present disclosure, after step S1 and before step S2, further comprises: forming a buffer layer on the base substrate.

Hereinafter, an exemplary fabrication method of an array substrate according to the embodiment of the present disclosure is described in conjunction with FIGS. 7(a) to (j), and here the region where the solar cell unit is located and the region where the thin film transistor is located are continuously shown with the thin film transistor of the top-gate type as an example, but there may be other components in an intermediate region of the two, which is not shown for simplicity.

Figure 7A:
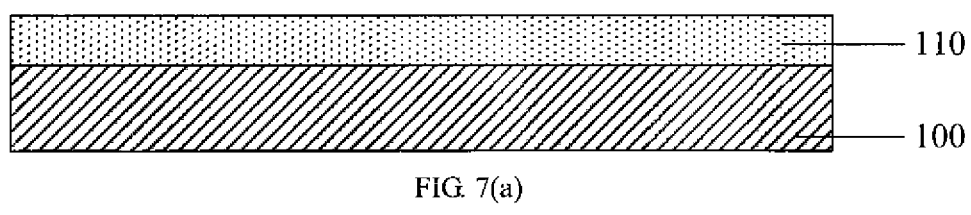
FIGS. 7(a)-7(j) show a cross-sectional view of respective steps of an exemplary fabrication method of an array substrate according to an embodiment of the present disclosure.
Figure 7B:
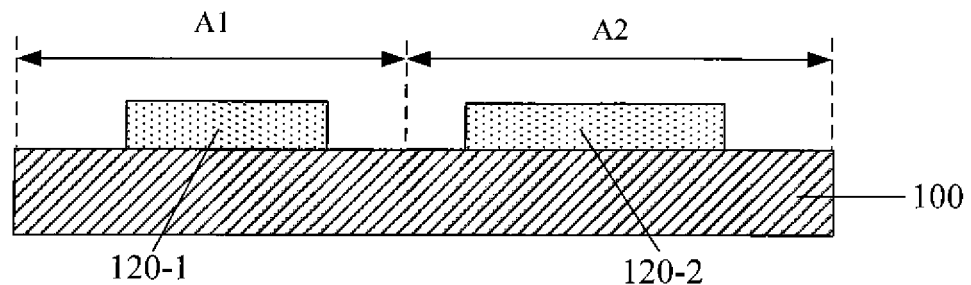
Figure 7C:
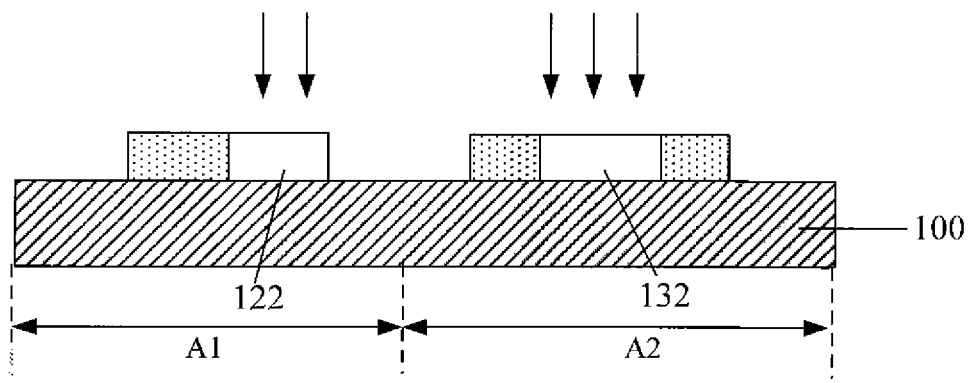
Figure 7D:
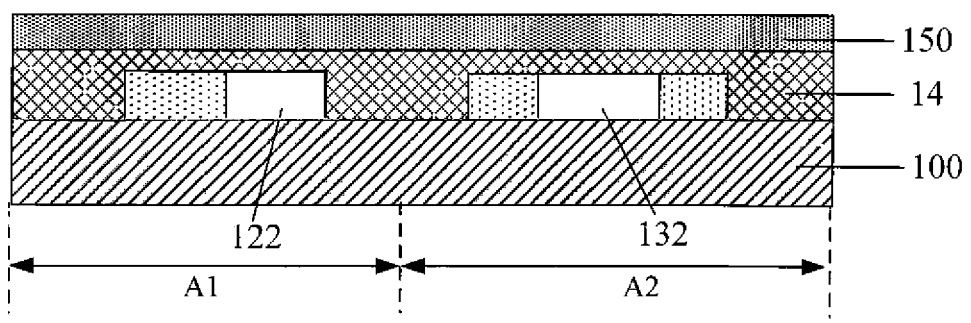
Figure 7E:
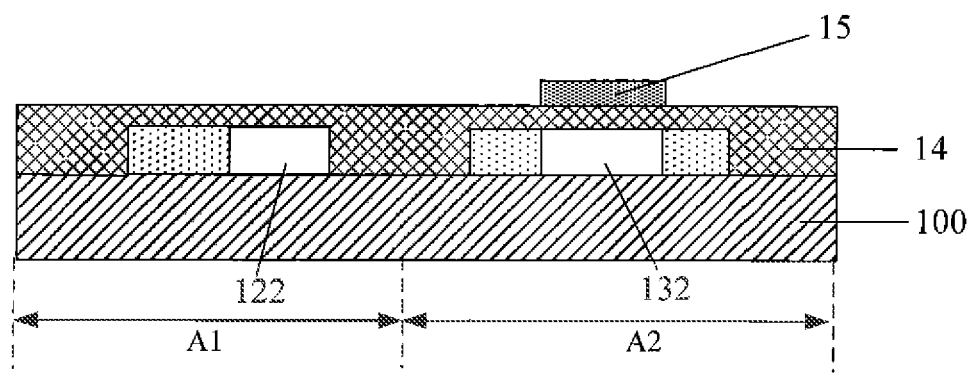
Figure 7F:
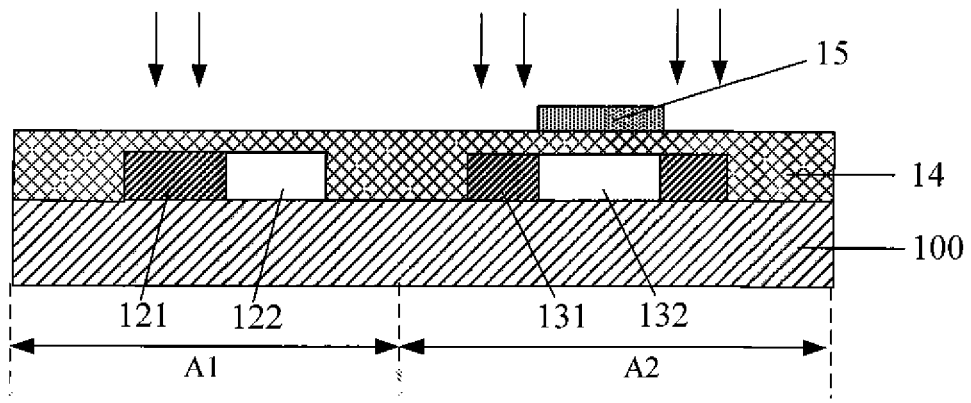
Figure 7G:
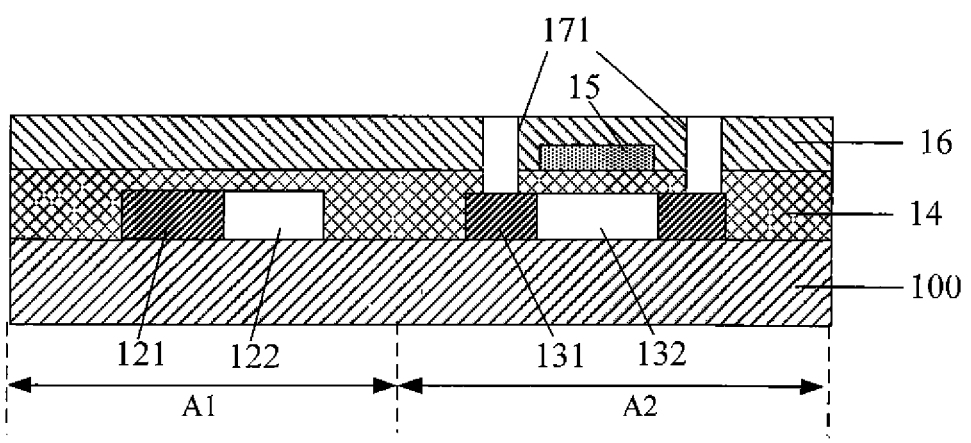
Figure 7H:
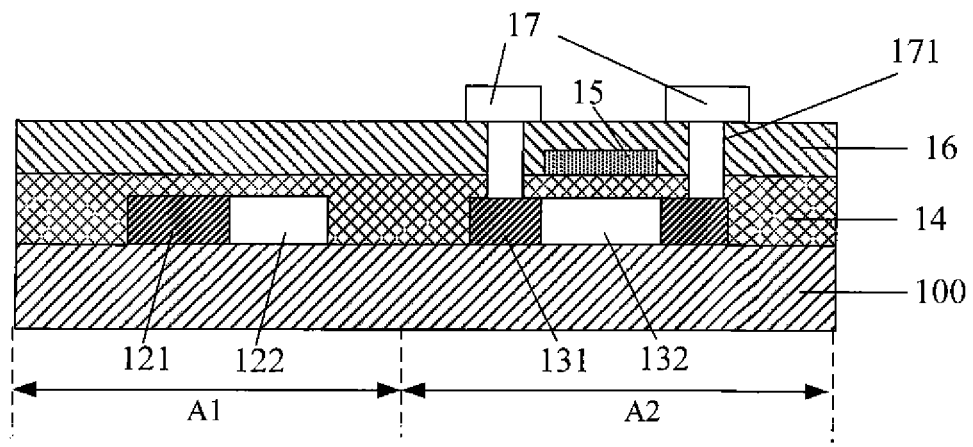

Step S11: preparing a base substrate 100, the base substrate 100 including: a display region 102 and a peripheral region 101 surrounding the display region 102;

Step S12: depositing a semiconductor material layer 110 on the base substrate 100, as shown in FIG. 7(a), then, forming a semiconductor layer 120 by a first patterning process, wherein, a semiconductor layer 120-1 in a thin film transistor region A1 and a semiconductor layer 120-2 in a solar cell unit region A2 are not connected with each other, as shown in FIG. 7(b);

Step S13: doping a P-type/N-type impurity to the semiconductor layer 120-1 in the thin film transistor region A1 with a first mask on the base substrate 100 obtained after step S12 is completed, to form an intermediate doped portion 132, and meanwhile doping the P-type/N-type impurity of a same type to the semiconductor layer 120-2 in the solar cell unit region A2 to form the P-type/N-type semiconductor 122, as shown in FIG. 7(c);

Step S14: sequentially depositing a gate insulating layer 14 and a gate metal layer 150 on the base substrate 100 after step S13 is completed, as shown in FIG. 7(d);

Step S15: patterning the gate metal layer 150 by a second patterning process, to form a pattern including a gate electrode 15 and a gate line (not shown) in the thin film transistor region, as shown in FIG. 7(e);

Step S16: doping the N-type/P-type impurity to the semiconductor layer 120-2 in the thin film transistor region A2 and both sides of the intermediate doped portion 132 with a second mask, to form side doped portions 131, and meanwhile doping the N-type/P-type impurity to an undoped portion of the semiconductor layer 120-1 in the solar cell unit region A1, to form the N-type/P-type semiconductor 121, as shown in FIG. 7(f), wherein, the side doped portions 131 are used as a source region and a drain region of the thin film transistor. Exemplarily, when the side doped portions are being formed, the gate electrode 15 may also be used as a doping mask;

Step S17: depositing an interlayer insulating layer 16 on the base substrate after step S16 is completed, and forming two via holes 171 corresponding to the source region and the drain region in the interlayer insulating layer and the gate insulating layer by a third patterning process, as shown in FIG. 7(g);

Step S18: forming a source/drain electrode metal layer 170 on the interlayer insulating layer 16, and forming a source electrode and a drain electrode 17 connected with the source region and the drain region 131 by a fourth patterning process, as shown in FIG. 7(h).

Further, a pixel electrode connected with the source electrode or the drain electrode may be formed in the thin film transistor region, and correspondingly, an electrode respectively connected with the P-type semiconductor and the N-type semiconductor may be formed in the solar cell unit region.

Figure 7I:
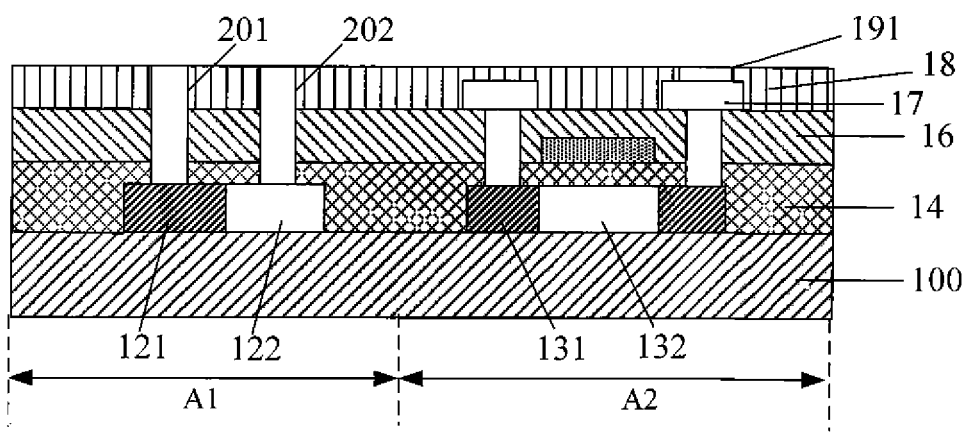
Figure 7J:
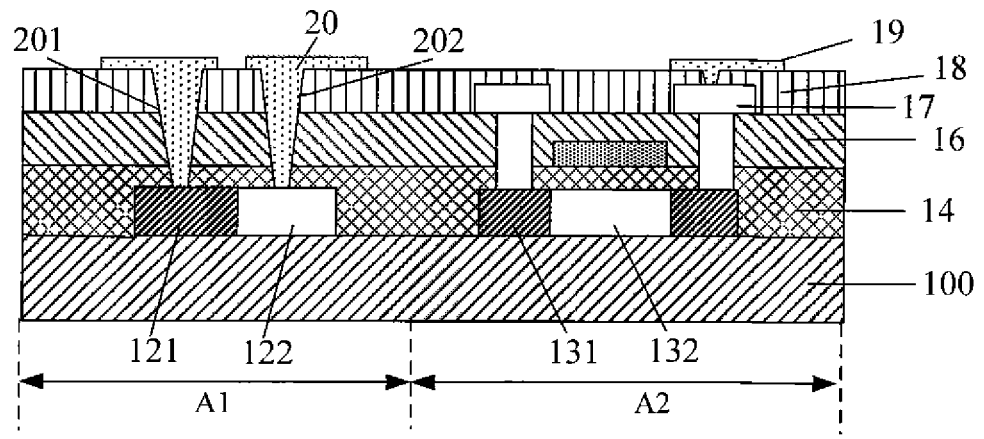

Exemplarily, after the above-described step S18, the method further comprises steps of:

Step S19: depositing a planarization layer 18 on the base substrate after step S18 is completed, and forming a via hole 191 above the source electrode or the drain electrode in the planarization layer by using a fifth patterning process, to expose the source electrode or the drain electrode 17, and forming via holes 201 and 202 corresponding to the P-type semiconductor and the N-type semiconductor in the planarization layer 18, the interlayer insulating layer 16 and the gate insulating layer 15 in the solar cell unit region A1, as shown in FIG. 7(i);

Step 20: depositing a metal layer 190 on the base substrate 100 after step S19 is completed, and patterning the metal layer 190 by a sixth patterning process, so as to form the electrode 20 and the pixel electrode 19, as shown in FIG. 7(j).

The above is described only with the thin film transistor of the top-gate type as an example, and for the thin film transistor of the bottom-gate type, a fabrication method thereof is similar, except that an order of forming respective layers is slightly different, but both the patterning process and the layer formation process are similar, which will not be repeated here.

It should be noted that, the patterning process referred to in the embodiment of the present disclosure usually includes photoresist coating, exposing, developing, etching, photoresist removing and other processes.

A Third Embodiment

The third embodiment of the present disclosure provides an organic light-emitting display device, comprising: a display panel, including the array substrate according to the first embodiment and an opposed substrate opposite to the array substrate.

Further, the organic light-emitting display device may further comprise an energy storage unit, configured to store electrical energy generated by at least one solar cell unit.

Exemplarily, the energy storage unit is respectively connected with two electrodes of the solar cell unit through wiring.

Exemplarily, the solar cell unit may directly supply electrical energy to a gate driver and/or a source/drain driver, so that the two electrodes thereof need not to be connected with the energy storage unit outside the array substrate, and only need to be connected through internal wiring.

Exemplarily, when the array substrate has a flexible base substrate, the organic light-emitting display device can implement thin and light-weighted flexible display which is bendable and even rollable, so that it can be applied to a watch, clothing, a backpack and other wearable products. In addition, an organic electroluminescent display device integrated with the solar cell unit can be implemented.

For the array substrate, the fabrication method thereof, and the organic light-emitting diode display device according to embodiments of the present disclosure, in the array substrate, at least one solar cell unit is located on the same side of the base substrate with the thin film transistor, and is formed in at least one of the plurality of pixel regions and the peripheral region; since the solar cell unit is disposed in the array substrate, the solar cell unit may be formed by a photolithography process; further, the solar cell unit and the thin film transistor are formed on the same side of the base substrate, so that the solar cell unit and the thin film transistor may be formed by the same process, and as a result, on the premise that the process flow and the fabrication material are not added, by using the fine photolithography process, the solar cell unit is formed in the thin film transistor array substrate, which thereby can reduce the production cost, improve the yield and make the product easy to be implemented. Furthermore, the organic light-emitting diode display device using the array substrate can integrate the organic light-emitting display device and the solar cell unit, and especially, when the flexible base substrate is used as the array substrate, it may also be integrated to a flexible display, in order to implement a self-powered, self-luminous and bendable display device.

The above are only specific embodiments of the present application, but the scope of the embodiment of the present disclosure is not limited thereto, and any skilled in the art, within the technical scope disclosed by the embodiment of the invention, can easily think of variations or replacements, which should be covered within the protection scope of the embodiment of the present disclosure.

The application claims priority of Chinese Patent Application No. 201510253423.9 filed on May 18, 2015, the disclosure of which is incorporated herein by reference in its entirety as part of the present application.

The invention claimed is:

1. An array substrate, comprising:
a base substrate, including:
a display region, including:
a plurality of data lines and a plurality of gate lines intersecting with each other,
a plurality of pixel regions, formed in a matrix and defined by the plurality of data lines and the plurality of gate lines intersecting with each other formed on the base substrate, wherein a thin film transistor is formed in each of the plurality of pixel regions;
a peripheral region, surrounding the display region; and
at least one solar cell unit, located on a same side of the base substrate with the thin film transistor; wherein the at least one solar cell unit includes a first doped semiconductor layer, a first electrode and a second electrode which are connected with the first doped semiconductor layer by a first via hole and a second via hole respectively, a gate insulating layer, an interlayer insulating layer, and a planarization layer; each of the pixel regions comprises a pixel electrode connected with a source electrode or a drain electrode of the thin film transistor by a third via hole; both the first via hole and the second via hole penetrate all of the gate insulating layer, the interlayer insulating layer, and the planarization layer, and the third via hole only penetrates the planarization layer;
an uppermost surface of the first electrode, an uppermost surface of the second electrode, and an uppermost surface of the pixel electrode which are away from the base substrate are located on a same layer, and all are located on an uppermost surface of the planarization layer away from the base substrate.

2. The array substrate according to claim 1, wherein the thin film transistor includes a second doped semiconductor layer, and the first doped semiconductor layer and the second doped semiconductor layer are located in a same layer.

3. The array substrate according to claim 2, wherein the number of the solar cell unit is two or more, and both of at least one of the plurality of pixel regions and the peripheral region are provided with the solar cell unit.

4. The array substrate according to claim 2, wherein one of the pixel regions is provided with one of the solar cell unit units.

5. The array substrate according to claim 2, wherein the first doped semiconductor layer includes a P-type semiconductor and an N-type semiconductor, and the P-type semiconductor and the N-type semiconductor are formed in a same layer; or the first doped semiconductor layer includes a P-type semiconductor, an N-type semiconductor and an intrinsic semiconductor disposed between the P-type semiconductor and the N-type semiconductor, and the P-type semiconductor and the N-type semiconductor are formed in a same layer.

6. The array substrate according to claim 5, wherein the second doped semiconductor layer includes: an intermediate doped portion and side doped portions located on both sides of the intermediate doped portion, which are formed in a same layer, the intermediate doped portion and the side doped portions having opposite doping types.

7. The array substrate according to claim 5, wherein the thin film transistor comprises an active layer, a source electrode and a drain electrode, the P-type semiconductor and the N-type semiconductor and the active layer are formed at a same layer, and one of the P-type semiconductor and the N-type semiconductor has a same material as the active layer, and the other one has a same material as the source electrode and the drain electrode.

8. The array substrate according to claim 7, wherein the thin film transistor further comprises a gate electrode, and the P-type semiconductor and the N-type semiconductor are insulated with the gate electrode.

9. The array substrate according to claim 2, wherein the first doped semiconductor layer includes a plurality of P-type semiconductors and a plurality of N-type semiconductors arranged alternately, and the plurality of P-type semiconductors and the plurality of N-type semiconductors are formed in a same layer.

10. The array substrate according to claim 9, wherein the first doped semiconductor layer further includes a plurality of intrinsic semiconductors, and each of the plurality of intrinsic semiconductors is disposed between the P-type semiconductor and the N-type semiconductor adjacent to each other.

11. A fabrication method of an array substrate, comprising:
preparing a base substrate, wherein, the base substrate includes a display region and a peripheral region surrounding the display region;
forming a plurality of gate lines, a plurality of data lines, a plurality of pixel regions defined by the plurality of data lines and the plurality of gate lines, a thin film transistor located in each of the pixel regions, and at least one solar cell unit located on a same side of the base substrate with the thin film transistor;
wherein the at least one solar cell unit includes a first doped semiconductor layer, a first electrode and a second electrode which are connected with the first doped semiconductor layer by a first via hole and a second via hole respectively, a gate insulating layer, an interlayer insulating layer, and a planarization layer;
each of the pixel regions comprises a pixel electrode connected with a source electrode or a drain electrode of the thin film transistor by a third via hole; both the first via hole and the second via hole penetrate all of the gate insulating layer, the interlayer insulating layer, and the planarization layer, and the third via hole only penetrates the planarization layer;
an uppermost surface of the first electrode, an uppermost surface of the second electrode, and an uppermost surface of the pixel electrode which are away from the base substrate are located on a same layer, and all are located on an uppermost surface of the planarization layer away from the base substrate.

12. The fabrication method according to claim 11, wherein, the thin film transistor includes a second doped semiconductor layer, and the first doped semiconductor layer and the second doped semiconductor layer are located in a same layer, wherein, the forming a plurality of gate lines, a plurality of data lines, a plurality of pixel regions defined by the plurality of data lines and the plurality of gate lines, a thin film transistor located in each of the pixel regions, and at least one solar cell unit located in the plurality of pixel regions, on a same side of the base substrate, includes:

simultaneously forming the first doped semiconductor layer and the second doped semiconductor layer by a patterning process and a doping process.

13. The fabrication method according to claim 12, wherein the first doped semiconductor layer includes a P-type semiconductor and an N-type semiconductor, the second doped semiconductor layer includes an intermediate doped portion and side doped portions located on both sides of the intermediate doped portion and having a doping type opposite to that of the intermediate doped portion, the forming a plurality of gate lines, a plurality of data lines, a plurality of pixel regions defined by the plurality of data lines and the plurality of gate lines, a thin film transistor located in each of the pixel regions, and at least one solar cell unit located in the plurality of pixel regions, on a same side of the base substrate, includes:

Step 1: forming a semiconductor material layer on the base substrate, and forming a semiconductor layer by a first patterning process, wherein, the semiconductor layers in the thin film transistor region and the at least one solar cell unit region are not connected with each other;

Step 2: doping a P-type/N-type impurity to the semiconductor layer in the thin film transistor region with a first mask on the base substrate obtained after step 1 is completed, to form the intermediate doped portion, and meanwhile doping the P-type/N-type impurity to the semiconductor layer in the solar cell unit region to form the P-type/N-type semiconductor;

Step 3: sequentially depositing a gate insulating layer and a gate metal layer on the base substrate after step 2 is completed;

Step 4: patterning the gate metal layer by a second patterning process, to form a pattern including the gate electrode and the gate line in the thin film transistor region;

Step 5: doping the N-type/P-type impurity to the semiconductor layer in the thin film transistor region and both sides of the intermediate doped portion with a second mask, to form the side doped portions, and meanwhile doping the N-type/P-type impurity to an undoped portion of the semiconductor layer in the solar cell unit region, to form the N-type/P-type semiconductor.

14. The fabrication method according to claim 13, wherein the semiconductor layer is a poly-crystalline silicon layer, and the forming the semiconductor layer on the base substrate includes:

depositing an amorphous silicon layer on the base substrate; and crystallizing the amorphous silicon layer to form the poly-crystalline silicon layer, by using a crystallization method.

15. The fabrication method according to claim 11, wherein the preparing a base substrate includes:

preparing a glass substrate;

coating a flexible base substrate material on the glass substrate, to form a flexible base substrate, and after the forming a plurality of gate lines, a plurality of data lines, a thin film transistor located in each of the plurality of pixel regions, and at least one solar cell unit located in the plurality of pixel regions, the fabrication method further comprises:

stripping the flexible base substrate and the thin film transistor and the at least one solar cell unit formed thereon from the glass substrate.

16. An organic light-emitting diode display device, comprising:

an array substrate, comprising:

a base substrate, including:

a display region, including:

a plurality of data lines and a plurality of gate lines intersecting with each other, a plurality of pixel regions, formed in a matrix and defined by the plurality of data lines and the plurality of gate lines intersecting with each other formed on the base substrate, wherein a thin film transistor is formed in each of the plurality of pixel regions;

a peripheral region, surrounding the display region; and at least one solar cell unit, located on a same side of the base substrate with the thin film transistor; and the at least one solar cell unit includes a first doped semiconductor layer, a first electrode and a second electrode which are connected with the first doped semiconductor layer by a first via hole and a second via hole respectively, a gate insulating layer, an interlayer insulating layer, and a planarization layer;

each of the pixel regions comprises a pixel electrode connected with a source electrode or a drain electrode of the thin film transistor by a third via hole; both the first via hole and the second via hole penetrate all of the gate insulating layer, the interlayer insulating layer, and the planarization layer, and the third via hole only penetrates the planarization layer;

an uppermost surface of the first electrode, an uppermost surface of the second electrode, and an uppermost surface of the pixel electrode which are away from the base substrate are located on a same layer, and all are located on an uppermost surface of the planarization layer away from the base substrate; and an opposed substrate, opposite to the array substrate.

17. The organic light-emitting diode display device according to claim 16, wherein the thin film transistor includes a second doped semiconductor layer, and the first doped semiconductor layer and the second doped semiconductor layer are located in a same layer.

18. The organic light-emitting diode display device according to claim 16, further comprising: an energy storage unit, configured to store electrical energy generated by the at least one solar cell unit, wherein the first doped semiconductor layer includes a P-type semiconductor and an N-type semiconductor, and the P-type semiconductor and the N-type semiconductor are formed in a same layer, the first electrode and the second electrode connected with the P-type semiconductor and the N-type semiconductor respectively, and the energy storage unit is respectively electrically connected with the first electrode and the second electrode.

* * * * *